United States Patent
Farjadrad et al.

(10) Patent No.: US 12,248,418 B2
(45) Date of Patent: *Mar. 11, 2025

(54) EFFICIENT SIGNALING SCHEME FOR HIGH-SPEED ULTRA SHORT REACH INTERFACES

(71) Applicant: MARVELL ASIA PTE LTD, Singapore (SG)

(72) Inventors: Ramin Farjadrad, Los Altos, CA (US); Paul Langner, Fremont, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 18/512,744

(22) Filed: Nov. 17, 2023

(65) Prior Publication Data

US 2024/0086350 A1     Mar. 14, 2024

Related U.S. Application Data

(63) Continuation of application No. 17/893,886, filed on Aug. 23, 2022, now Pat. No. 11,822,369, which is a continuation of application No. 17/108,519, filed on Dec. 1, 2020, now Pat. No. 11,422,961, which is a continuation of application No. 15/451,920, filed on Mar. 7, 2017, now Pat. No. 10,855,498.

(Continued)

(51) Int. Cl.
  *G06F 13/36*   (2006.01)
  *H04L 7/00*    (2006.01)
  *H04L 25/20*   (2006.01)

(52) U.S. Cl.
  CPC ............ *G06F 13/36* (2013.01); *H04L 7/0091* (2013.01); *H04L 25/20* (2013.01)

(58) Field of Classification Search
  CPC ... H04L 25/20; H04L 7/0091; G06F 13/4291; G06F 13/36; G06F 13/4022; G06F 13/4068; H01L 25/0655
  See application file for complete search history.

(56) References Cited

U.S. PATENT DOCUMENTS 6,031,729 A    2/2000   Berkely et al.
6,141,719 A *  10/2000  Rafferty .............. G06F 13/4022
                                                     710/316

(Continued)

OTHER PUBLICATIONS

U.S. Appl. No. 18/662,627, filed May 13, 2024, Ramin Farjadrad.

*Primary Examiner* — Syed Ali

(57) ABSTRACT

A multi-chip package includes first and second groups of integrated circuit (IC) chips and a transfer IC chip disposed in the multi-chip package. The transfer IC chip is communicatively interposed between the first and second groups of IC chips and is configured to transfer signals from at least a first IC chip of the first group of IC chips to at least a second IC chip of the second group of IC chips or an output interface. The output interface is configured to output first data from the multi-chip package. A first set of ultra-short reach (USR) signaling links connects the first group of IC chips to the transfer IC chip. A second set of USR signaling links connects the second group of IC chips to the transfer IC chip. Each of the USR signaling links comprises a trace length of less than one inch.

15 Claims, 3 Drawing Sheets

Related U.S. Application Data

(60) Provisional application No. 62/341,871, filed on May 26, 2016, provisional application No. 62/314,237, filed on Mar. 28, 2016.

(56) References Cited

U.S. PATENT DOCUMENTS

| | | |
|---|---|---|
| 6,417,737 B1 | 7/2002 | Moloudi et al. |
| 6,621,155 B1 | 9/2003 | Perino et al. |
| 6,690,742 B2 | 2/2004 | Chan |
| 6,721,313 B1 | 4/2004 | Van Duyne |
| 6,772,351 B1 | 8/2004 | Werner et al. |
| 6,836,144 B1 | 12/2004 | Bui et al. |
| 6,932,618 B1 | 8/2005 | Nelson |
| 7,205,788 B1 | 4/2007 | Wang et al. |
| 7,477,615 B2 | 1/2009 | Oshita et al. |
| 7,535,958 B2 | 5/2009 | Best |
| 7,978,754 B2 | 7/2011 | Yeung et al. |
| 8,004,330 B1 | 8/2011 | Acimovic et al. |
| 8,121,541 B2 | 2/2012 | Rofougaran |
| RE43,720 E | 10/2012 | Perino et al. |
| 8,483,579 B2 | 7/2013 | Fukuda |
| 8,546,955 B1 | 10/2013 | Wu |
| 8,638,838 B1 | 1/2014 | Betts et al. |
| 8,948,203 B1 | 2/2015 | Nolan et al. |
| 8,982,905 B2 | 3/2015 | Kamble et al. |
| 9,088,334 B2 | 7/2015 | Chakraborty et al. |
| 9,294,313 B2 | 3/2016 | Prokop et al. |
| 9,432,298 B1 | 8/2016 | Smith |
| 9,886,275 B1 | 2/2018 | Carlson et al. |
| 9,961,812 B2 | 5/2018 | Suorsa |
| 10,642,767 B1 * | 5/2020 | Farjadrad ................. G06F 13/36 |
| 2003/0062921 A1 | 4/2003 | Johnson et al. |
| 2004/0088444 A1 | 5/2004 | Baumer |
| 2004/0100309 A1 | 5/2004 | Best et al. |
| 2004/0113239 A1 | 6/2004 | Prokofiev et al. |
| 2005/0041683 A1 | 2/2005 | Kizer |
| 2005/0089126 A1 | 4/2005 | Zerbe et al. |
| 2005/0205983 A1 | 9/2005 | Origasa et al. |
| 2006/0060376 A1 | 3/2006 | Yoon et al. |
| 2006/0103011 A1 | 5/2006 | Andry et al. |
| 2006/0158229 A1 | 7/2006 | Hsu et al. |
| 2006/0170453 A1 | 8/2006 | Zerbe et al. |
| 2006/0244480 A1 | 11/2006 | Chan |
| 2006/0250985 A1 | 11/2006 | Baumer |
| 2007/0281643 A1 | 12/2007 | Kawai |
| 2007/0290712 A1 | 12/2007 | Gomez et al. |
| 2008/0063395 A1 | 3/2008 | Royle et al. |
| 2008/0186987 A1 | 8/2008 | Baumer |
| 2008/0222407 A1 | 9/2008 | Carpenter et al. |
| 2008/0310491 A1 | 12/2008 | Abbasfar et al. |
| 2009/0113158 A1 | 4/2009 | Schnell et al. |
| 2009/0154365 A1 | 6/2009 | Diab et al. |
| 2009/0220240 A1 | 9/2009 | Abhari et al. |
| 2009/0304054 A1 | 12/2009 | Tonietto et al. |
| 2010/0048043 A1 | 2/2010 | Morlion et al. |
| 2010/0197231 A1 | 8/2010 | Kenington |
| 2010/0294547 A1 | 11/2010 | Hatanaka et al. |
| 2011/0038286 A1 | 2/2011 | Ta et al. |
| 2011/0187430 A1 | 8/2011 | Tang et al. |
| 2011/0204428 A1 | 8/2011 | Erickson et al. |
| 2012/0082194 A1 | 4/2012 | Tam et al. |
| 2012/0182776 A1 | 7/2012 | Best et al. |
| 2012/0216084 A1 | 8/2012 | Chun et al. |
| 2012/0327818 A1 | 12/2012 | Takatori |
| 2013/0222026 A1 | 8/2013 | Havens |
| 2013/0249290 A1 | 9/2013 | Buonpane et al. |
| 2014/0016524 A1 | 1/2014 | Choi et al. |
| 2014/0126613 A1 | 5/2014 | Zhang et al. |
| 2014/0192583 A1 | 7/2014 | Rajan et al. |
| 2014/0269860 A1 | 9/2014 | Brown et al. |
| 2014/0269983 A1 | 9/2014 | Baeckler et al. |
| 2015/0012677 A1 | 1/2015 | Nagarajan et al. |
| 2015/0146766 A1 | 5/2015 | Longo et al. |
| 2015/0180760 A1 | 6/2015 | Rickard |
| 2015/0271074 A1 | 9/2015 | Hirth |
| 2015/0319768 A1 | 11/2015 | Abdelmonem et al. |
| 2015/0326348 A1 | 11/2015 | Shen et al. |
| 2016/0071818 A1 | 3/2016 | Wang et al. |
| 2016/0217872 A1 | 7/2016 | Hossain et al. |
| 2017/0220508 A1 * | 8/2017 | Kaviani ............. G06F 13/4022 |
| 2017/0220509 A1 * | 8/2017 | Kaviani ............. G06F 13/4031 |
| 2018/0010329 A1 | 1/2018 | Golding, Jr. et al. |
| 2019/0058457 A1 | 2/2019 | Ran et al. |
| 2019/0108111 A1 | 4/2019 | Levin et al. |

\* cited by examiner

EFFICIENT SIGNALING SCHEME FOR HIGH-SPEED ULTRA SHORT REACH INTERFACES

CROSS-REFERENCE TO RELATED APPLICATIONS

This application is a Continuation of U.S. patent application Ser. No. 17/893,886, filed Aug. 23, 2022, entitled EFFICIENT SIGNALING SCHEME FOR HIGH-SPEED ULTRA SHORT REACH INTERFACES, (now U.S. Pat. No. 11,822,369, issued Nov. 21, 2023), which is a Continuation of U.S. patent application Ser. No. 17/108,519, filed Dec. 1, 2020, entitled EFFICIENT SIGNALING SCHEME FOR HIGH-SPEED ULTRA SHORT REACH INTERFACES, (now U.S. Pat. No. 11,422,961, issued Aug. 23, 2022), which is a Continuation of U.S. patent application Ser. No. 15/451,920, filed Mar. 7, 2017, entitled EFFICIENT SIGNALING SCHEME FOR HIGH-SPEED ULTRA SHORT REACH INTERFACES, (now U.S. Pat. No. 10,855,498, issued Dec. 1, 2020), which is a Non-Provisional that claims priority to U.S. Provisional Application No. 62/314,237, filed Mar. 28, 2016, entitled EFFICIENT SIGNALING SCHEME FOR HIGH-SPEED VSR LINKS, and U.S. Provisional Application No. 62/341,871, filed May 26, 2016, entitled EFFICIENT SIGNALING SCHEME FOR HIGH-SPEED ULTRA SHORT REACH INTERFACES, all of which are incorporated herein by reference in their entirety.

TECHNICAL FIELD

The disclosure herein relates to communications systems, and more specifically to high-speed multi-chip signaling systems and methods.

BACKGROUND

Integrated circuit chip designers continually integrate more and more features and functions into single integrated circuit chips. Integrating into such small scale often provides scale-related advantages and performance, which is why SoCs (system on chip) approaches have been of high interest in the past decade. However, very large chips with too many functions integrated on them often lead to a yield and thus cost disadvantage. Because the defect density of a semiconductor fabrication process is generally fixed per unit area, the chip yield often drops exponentially (not linearly) with an increase in area. One alternative to integrating all functions and features into a single large chip is to spread the functions and features out among multiple smaller chips, and package the chips together into a single integrated circuit package.

While conventionally employing multiple chips into a single package works well for its intended applications, there are often instances where the multiple chips need to communicate amongst themselves at very high data rates. Enabling such high-throughput communication among any two or more chips in the same package (or module) in a power efficient and cost efficient manner would be highly desirable.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Embodiments of apparatus and methods for efficient packaging of multi-chip modules (MCM) are disclosed. In one embodiment, a packaged semiconductor device includes a substrate and first, second, and third integrated circuit (IC) chips. The first integrated circuit (IC) chip is mounted on the substrate to receive first data and includes a first transfer interface to transmit the first data via first conductors formed in the substrate. The second IC chip mounts on the substrate and has a second transfer interface to receive the first data. The second IC includes on-chip conductors to route the first data on-chip to an output interface. The output interface transmits the first data via second conductors formed on the substrate. A third IC chip mounts on the substrate and has a third transfer interface to receive the first data via the second conductors.

Figure 1:
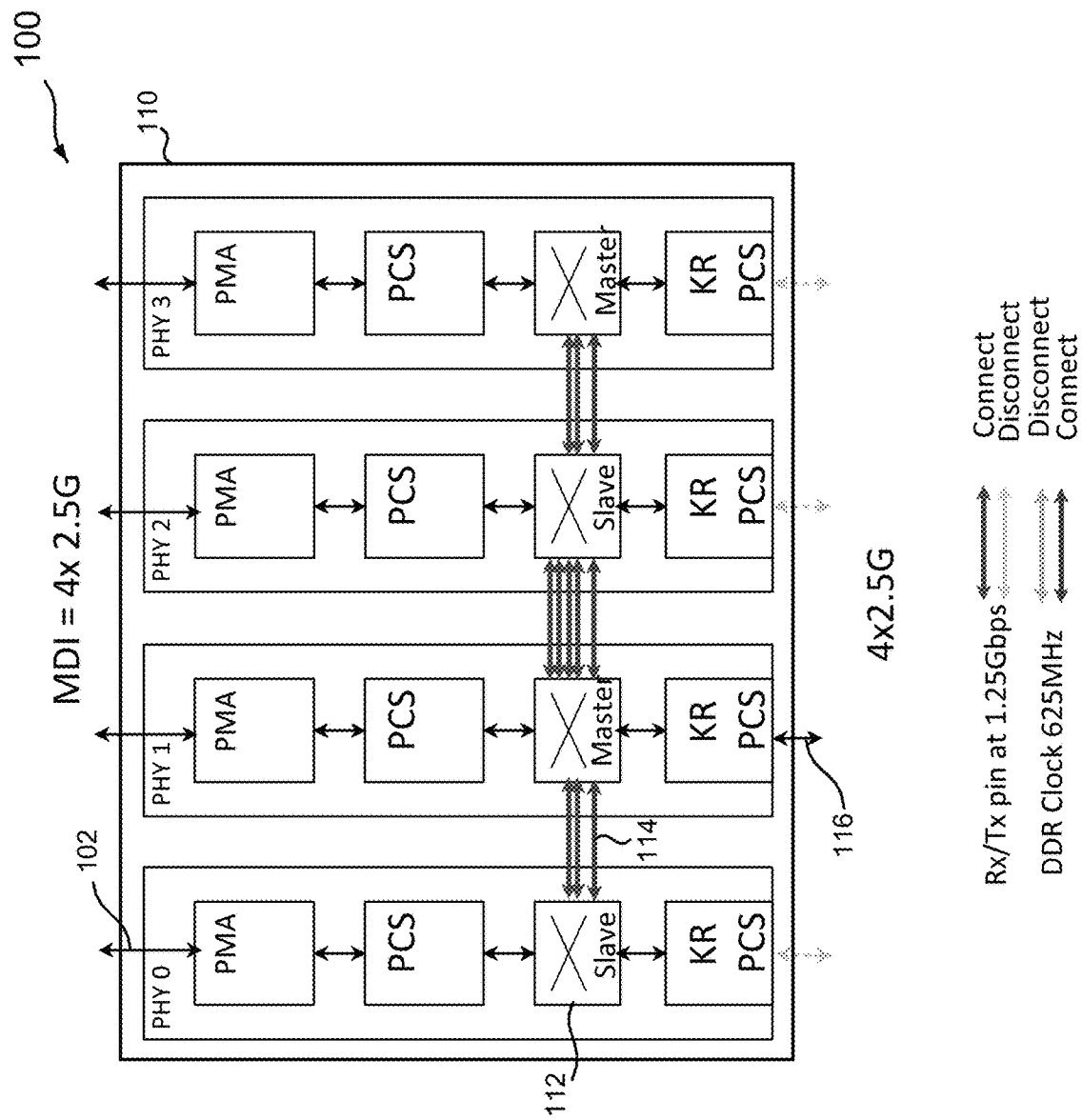
FIG. 1 illustrates one embodiment of a multi-chip module (MCM) for a quad-PHY Ethernet transceiver circuit.

FIG. 1 illustrates one embodiment of a multi-chip module (MCM) architecture, generally designated 100. Multiple integrated circuit (IC) chips PHY 0, PHY 1, PHY 2 and PHY 3 are disposed on a package substrate 110 to form an IC package. Each IC chip represents a high-speed Ethernet transceiver, often referred to as a "PHY." For one embodiment, the three IC chips are disposed in a collinear planar arrangement on the substrate.

Further referring to FIG. 1, each PHY includes signal conditioning circuitry PMA, such as crosstalk cancellers, echo cancellers, adaptive filters, and so forth that may be employed consistent with high-speed Ethernet standards, including for example 10 GBASE-T and NBASE-T. The PMA forms one end of an Ethernet channel or port, such as at 102, for connection to an Ethernet medium, such as twisted pair copper cable. For one embodiment, each Ethernet channel transceives data at up to a 2.5 Gbps data rate, for an aggregate data rate of 10 Gbps. The signal conditioning circuitry PMA couples to a physical coding sublayer PCS that performs a variety of Ethernet-based coding functions.

Further referring to FIG. 1, each IC chip includes an off-chip data transfer interface 112 that efficiently transfers and/or receives data from one or more adjacent IC chips for data aggregation purposes. In one embodiment, each transfer interface includes plural bidirectional source synchronous links, such as at 114, to route data and an accompanying timing signal, such as a double-data rate (DDR) clock, from one chip to an adjacent chip. In some circumstances, a given transfer interface may act as a repeater to pass data to a chip that originates from a non-adjacent chip. Using the middle chips, such as PHY1 and PHY2, as signal repeaters eliminates the need to route those signal through the package/module substrate layers and under the middle chips where routability is very limited and adding routing layers is fairly costly. Ultra-sub-micron chips with very high routing density can easily provide many repeater channels at very low cost. The timing of a digital data bus that passes through a middle chip can be synchronized to be the same as the source chip or alternatively resynchronized to the middle chip clock domain before passing to the following chip.

For one embodiment, eight links may be connected to a given transfer interface for each chip (four links to one chip, four links to another). One end of the link may be configured as a master integrated circuit (IC) chip, while the other end may be configured as a slave IC chip. The master IC chip may generate and supply a timing signal such as a clock signal CK along a clock path to synchronize the transfer and receipt of data via the link in a source synchronous fashion. One such embodiment is described in copending U.S. patent Ser. No. 15/364,030, titled "Efficient Signaling Scheme For High-Speed Ultra Short Reach Interfaces", filed Nov. 29, 2016, assigned to the assignee of the present application and expressly incorporated herein by reference.

With continued reference to FIG. 1, each IC chip also includes a serial interface port labeled as KR/PCS that is selectively enabled based on the module configuration. One specific embodiment utilizes a USXGMII port for each chip. For the embodiment of FIG. 1, only the serial interface for PHY 1 has been enabled, at 116. Consequently, for the specific configuration shown, all data transferred to and from the MDI link end, which has the four Ethernet ports 102, is done so through the one enabled serial link port KR/PCS associated with PHY 1, at 116.

In operation, the MCM 100 of FIG. 1 is configured with four Ethernet ports 102 at the line end, and a single serial link port 116 opposite the line end. From a data receive perspective at the line end, the MCM of FIG. 1 receives data from the four Ethernet ports PHY 0-PHY 3 at a data rate of 2.5 Gbps for each port, and directs the data and aggregates it for transfer along the serial port 116 enabled for PHY1, at a 10 Gbps data rate.

Further referring to FIG. 1, the 2.5 Gbps data received by PHY 0 is transferred along two of the single-ended links 114 provided by the transfer interface (shown in FIG. 2) to the transfer interface of PHY 1, with each link operating at, for example, 1.25 Gbps. A link also provides a 625 MHz DDR clock for source synchronous timing synchronization. The transfer interface for PHY 1 includes four additional I/O ports that connect to four more links that are connected to PHY 2. Two of the links transfer the 2.5 Gbps data received by the Ethernet port of PHY 2, while the other two links provide 2.5 Gbps data transferred from PHY 3 to PHY 2 (along two transfer interface links between PHY 2 and PHY 3). PHY 2 thus acts as a repeater for the data being transferred from PHY 3. When aggregated at PHY 1, the data may be serialized in an acceptable manner to achieve a 10 Gbps data transfer rate at the serial interface KR/PCS, at 116.

Figure 2:
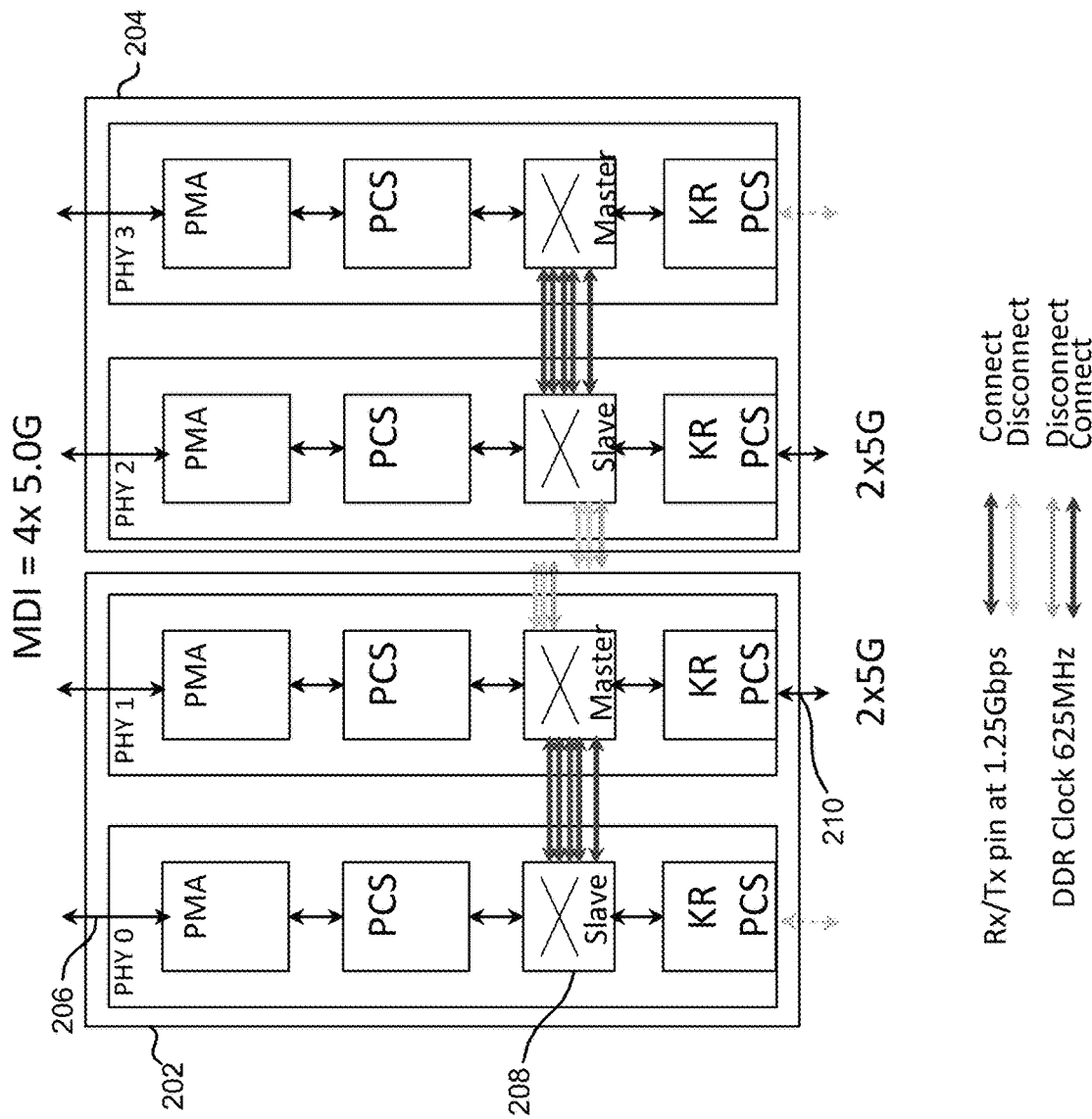
FIG. 2 illustrates a further embodiment of two multi-chip modules for two dual-PHY Ethernet transceiver circuits.

FIG. 2 illustrates an embodiment of two dual port multi-chip modules (MCM), 202 and 204. Each MCM includes a pair of Ethernet transceiver chips disposed on a package substrate, such as PHY 0, PHY 1 and PHY 2, PHY 3. Each chip includes an Ethernet port 206 for connecting to an Ethernet cable and transceiving data at a rate of, for example, 5 Gbps. Respective transfer interface circuits 208 are disposed on each chip to transfer data between the pair of chips for each module. Serial interface circuitry 210 on each chip is selectively enabled such that, for example, only one serial interface port is utilized for each MCM 202 and 204 to transfer data at 10 Gbps. The transfer interface 208 allows for an aggregation/disaggregation of data between the two Ethernet ports and a single serial link, similar to the 4:1 aggregation ratio described with the MCM architecture of FIG. 1. Needless to say, the four ports in FIG. 2 can all be bundled in a single multi-chip module (on the same substrate), while all connections stay the same as shown.

Figure 3:
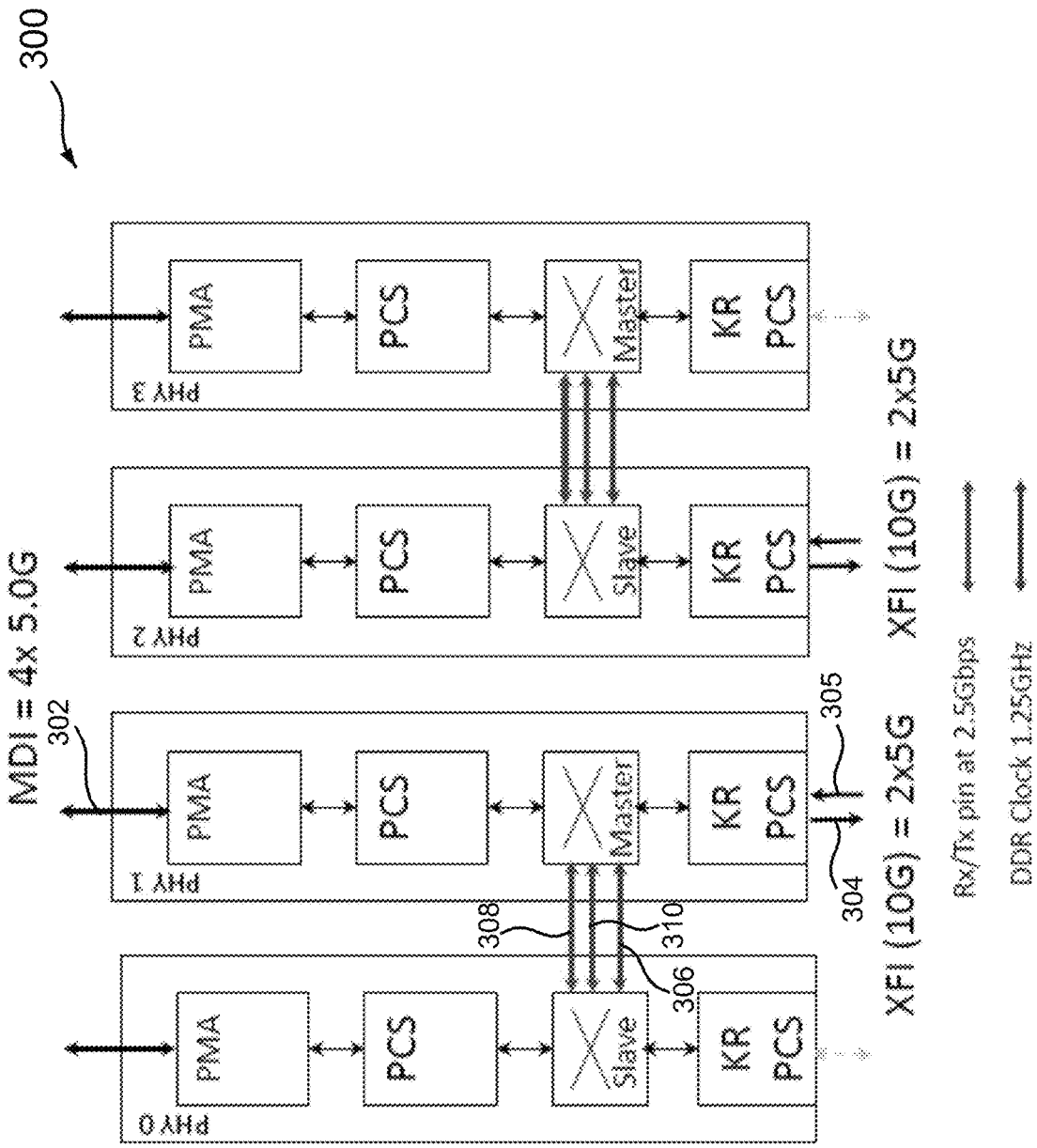
FIG. 3 illustrates an additional embodiment of a quad multi-chip module with a dual XFI interface.

One embodiment of a quad MCM that implements a dual SerDes interface is shown in FIG. 3, generally designated 300. The MCM includes four Ethernet transceiver chips PHY0, PHY1, PHY2, and PHY3 that are mounted on a common package substrate (not shown). The chips each include an Ethernet port, such as at 302, and a serial port, such as at 304. For one embodiment, the Ethernet ports each transceive data at 5 Gbps. As more fully explained below, less than all of the serial ports are enabled. To steer data and aggregate data for fewer (but faster) serial ports, each chip includes one clock pin, such as at 306, and two bi-directional single-ended data pins, such as at 308 and 310. For one embodiment, each data pin transmits and receives data at 2.5 Gbps, while the clock pin carries a double-data rate (DDR) clock at a frequency of 1.25 GHz. A slave PHY, such as PHY0, uses the clock associated with a master PHY, such as PHY1, to receive data from the master PHY and transmit data back to the master PHY. For one embodiment, the master and slave designations are hard-coded. Aggregated data may be transferred serially over enabled serial ports 304 and 305 at, for example, 10 Gbps.

For some embodiments, it may be desirable to limit power consumption by taking into consideration the optimal value of a termination impedance associated with each link driver. Embodiments of circuits to carry this out are described in the aforementioned copending U.S. patent Ser. No. 15/364,030, titled "Efficient Signaling Scheme For High-Speed Ultra Short Reach Interfaces", filed Nov. 29, 2016, assigned to the assignee of the present application and expressly incorporated herein by reference.

The embodiments described above thus provide minimal overhead and complexity while simultaneously providing very high data rates for MCM signaling environments, such as network switch architectures. By providing on-chip transfer interfaces, less complicated chip packaging architectures may be employed, thus reducing cost.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments.

Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A multi-chip package, comprising:
a first group of integrated circuit (IC) chips disposed in the multi-chip package;
a second group of IC chips disposed in the multi-chip package;
a transfer IC chip disposed in the multi-chip package, the transfer IC chip communicatively interposed between the first group of IC chips and the second group of IC chips, the transfer IC chip configured to transfer signals from at least a first IC chip of the first group of IC chips to at least a second IC chip of the second group of IC chips or an output interface, the output interface configured to output first data from the multi-chip package;
a first set of ultra-short reach (USR) signaling links connecting the first group of IC chips to the transfer IC chip; and
a second set of USR signaling links connecting the second group of IC chips to the transfer IC chip,
each of the USR signaling links comprises a trace length of less than one inch.

2. The multi-chip package of claim 1, wherein:
each of the USR signaling links comprises a simultaneously bidirectional signaling link.

3. The multi-chip package of claim 1, further comprising a common package substrate, wherein at least one IC chip of the first group of IC chips, at least one IC chip of the second group of IC chips, and the transfer IC chip are mounted to the common package substrate in a planar configuration.

4. The multi-chip package of claim 1, wherein the transfer IC chip is configured as a repeater.

5. The multi-chip package of claim 1, wherein the transfer IC chip includes switching circuitry to selectively forward the signals from the at least the first IC chip of the first group of IC chips to the at least the second IC chip of the second group of IC chips or the output interface.

6. A semiconductor device package, comprising:
a first group of IC chips disposed in the semiconductor device package and including a first integrated circuit (IC) chip to transmit first data off the first IC chip; and
a transfer IC chip disposed in the semiconductor device package, the transfer IC chip to receive the first data from the first IC chip via at least one first bidirectional link, the transfer IC chip including switching circuitry to selectively forward the first data to one of a first output interface or a second output interface, the first output interface communicatively coupled to a third IC chip of a second group of IC chips via at least one second bidirectional link, the second group of IC chips being disposed in the semiconductor device package, the second output interface configured to output the first data from the semiconductor device package;
wherein the at least one first bidirectional link further comprises a first set of ultra-short reach (USR) bidirectional signaling links connecting the first group of IC chips to the transfer IC chip;
wherein the at least one second bidirectional link further comprises a second set of USR bidirectional signaling links connecting the second group of IC chips to the transfer IC chip; and
wherein each of the USR bidirectional signaling links comprises a trace length of less than one inch.

7. The semiconductor device package of claim 6, wherein the transfer IC chip further comprises on-chip conductors to supply the first data on-chip to the switching circuitry.

8. The semiconductor device package of claim 6, wherein the second output interface comprises a serial data port for communicating with a serial link.

9. The semiconductor device package of claim 6, wherein each of the USR bidirectional signaling links comprises a simultaneously bidirectional signaling link.

10. The semiconductor device package of claim 6, further comprising a common package substrate, wherein at least one IC chip of the first group of IC chips, at least one IC chip of the second group of IC chips, and the transfer IC chip are mounted to the common package substrate in a planar configuration.

11. A semiconductor device, comprising:
a chip package comprising a first group of IC chips and a second group of IC chips; and
a first integrated circuit (IC) chip disposed in the chip package, the first IC chip having an input interface to receive first data from the first group of IC chips via at least one first bidirectional link, the first IC chip including switching circuitry to selectively forward the first data to one of a first output interface or a second output interface, the first output interface for coupling to the second group of IC chips via at least one second bidirectional link, the second output interface configured to output the first data from the chip package;

wherein the at least one first bidirectional link further comprises a first set of ultra-short reach (USR) bidirectional signaling links connecting the first group of IC chips to the first IC chip;

wherein the at least one second bidirectional link further comprises a second set of USR bidirectional signaling links connecting the second group of IC chips to the first IC chip; and wherein each of the USR bidirectional signaling links comprises a trace length of less than one inch.

12. The semiconductor device of claim 11, wherein the first IC chip includes on-chip conductors to supply the first data on-chip from the input interface to the switching circuitry.

13. The semiconductor device of claim 11, wherein the first IC chip is configured as a repeater.

14. The semiconductor device of claim 11, wherein the second output interface comprises a serial data port for communicating with a serial link.

15. The semiconductor device of claim 11, wherein the chip package comprises a common package substrate, and wherein the first IC chip is configured for mounting to the common package substrate in a planar orientation with the first group of IC chips and the second group of IC chips.

* * * * *